United States Patent
Hwang et al.

(10) Patent No.: US 11,581,211 B2
(45) Date of Patent: Feb. 14, 2023

(54) ELECTROSTATIC CHUCK HAVING A COOLING STRUCTURE

(71) Applicant: MICO CERAMICS LTD., Anseong (KR)

(72) Inventors: Jeonghun Hwang, Osan (KR); Hankyun Yoo, Anseong (KR)

(73) Assignee: MICO CERAMICS LTD., Anseong (KR)

( * ) Notice: Subject to any disclaimer, the term of this patent is extended or adjusted under 35 U.S.C. 154(b) by 179 days.

(21) Appl. No.: 17/063,302

(22) Filed: Oct. 5, 2020

(65) Prior Publication Data

US 2021/0143043 A1    May 13, 2021

(30) Foreign Application Priority Data

Nov. 12, 2019    (KR) .......................... 10-2019-0144080

(51) Int. Cl.
*H01L 21/683* (2006.01)
*H01L 21/67* (2006.01)

(52) U.S. Cl.
CPC .... *H01L 21/6833* (2013.01); *H01L 21/67109* (2013.01)

(58) Field of Classification Search
CPC ............... B23Q 3/15; H01L 21/67017; H01L 21/67098; H01L 21/67109; H01L 21/6831; H01L 21/6833; H01L 21/6835; H02N 13/00
See application file for complete search history.

(56) References Cited

U.S. PATENT DOCUMENTS

| 11,011,405 | B2* | 5/2021 | Lee | H01L 21/68757 |
| 2013/0308244 | A1* | 11/2013 | Shiraiwa | H02N 13/00 361/234 |
| 2014/0069585 | A1* | 3/2014 | Aoto | H01J 37/32807 156/345.52 |
| 2018/0047605 | A1* | 2/2018 | Gratrix | H01L 21/6831 |

FOREIGN PATENT DOCUMENTS

WO    WO-0223600 A1 *    3/2002    ....... H01L 21/67103

* cited by examiner

*Primary Examiner* — Jared Fureman
*Assistant Examiner* — Nicolas Bellido (57) ABSTRACT

Disclosed is an electrostatic chuck with a cooling structure using a cooling gas. The electrostatic chuck comprises: an electrostatic chuck plate that includes a plurality of first cooling gas holes formed in a first region and a plurality of second cooling gas holes formed in a second region; and a base member that includes a first flow path pattern connected to the plurality of first cooling gas holes, a second flow path pattern connected to the plurality of second cooling gas holes, and an inlet moving pattern changing a position of an inlet of a cooling gas injected into the first flow path pattern.

19 Claims, 12 Drawing Sheets

FIG. 1A

--Prior Art--

FIG. 1B

--Prior Art--

ELECTROSTATIC CHUCK HAVING A COOLING STRUCTURE

CROSS-REFERENCE TO RELATED APPLICATIONS

This application claims priority to Korean Patent Application No. 10-2019-0144080 filed on Nov. 12, 2019 in Korean Intellectual Property Office, the entire contents of which is hereby incorporated by reference in its entirety.

BACKGROUND OF THE INVENTION

1. Field of the Invention

The present disclosure relates to an electrostatic chuck and, more particularly, to an electrostatic chuck with a cooling structure using a cooling gas.

2. Description of the Prior Art

In general, semiconductor devices and display devices are fabricated in such a way as to stack a plurality of thin film layers including a dielectric layer and a metal layer on a glass substrate, a flexible substrate, or a semiconductor wafer substrate in order, and then pattern the thin film layers. These thin film layers are deposited on the substrate in order using a chemical vapor deposition (CVD) process or a physical vapor deposition (PVD) process.

To support various substrates such as a glass substrate, a flexible substrate, and a semiconductor wafer substrate, and particularly to fix these substrates using electrostatic force, an electrostatic chuck (ESC) is disposed in a chamber device for performing these semiconductor processes. The ESC is usually made up of a base member and an electrostatic chuck plate (or an electrostatic chuck structure) disposed above the base member. Here, the electrostatic chuck plate is a multi-layer structure that functions as the ESC, and includes an insulating layer, an electrode layer on the insulating layer, and a dielectric layer on the electrode layer. Further, the ESC has a cooling structure for uniformly cooling a substrate in a chamber using an external cooling gas (e.g., a helium (He) gas).

Figure 1A:
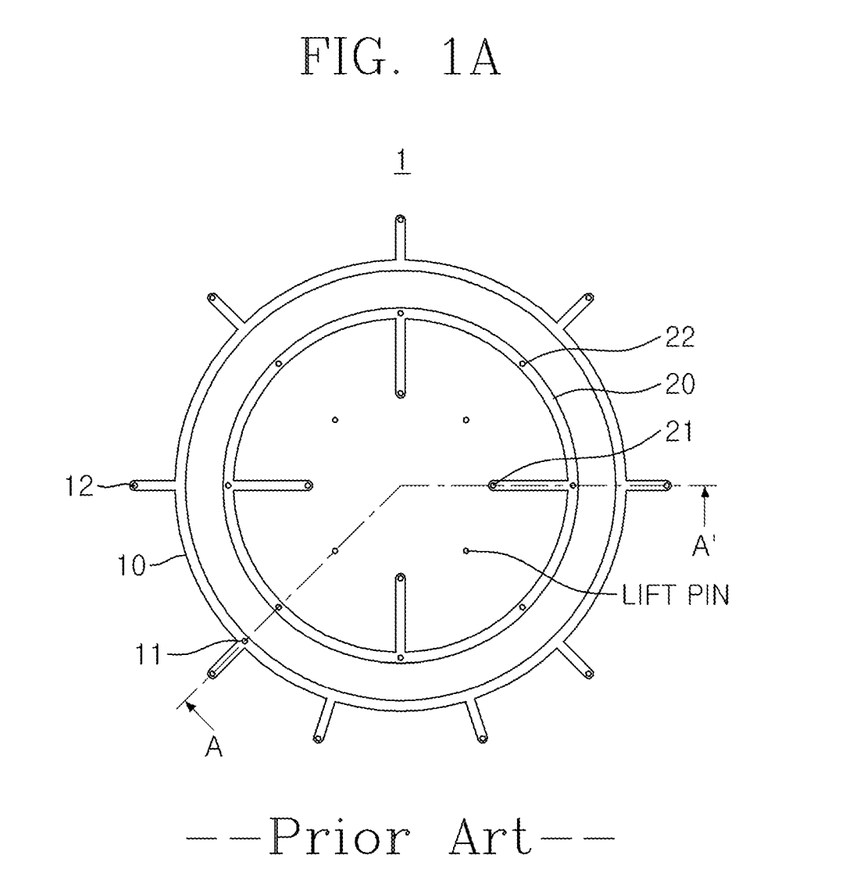
FIGS. 1A and 1B are a view illustrating a cooling structure of an electrostatic chuck according to the related art.
Figure 1B:
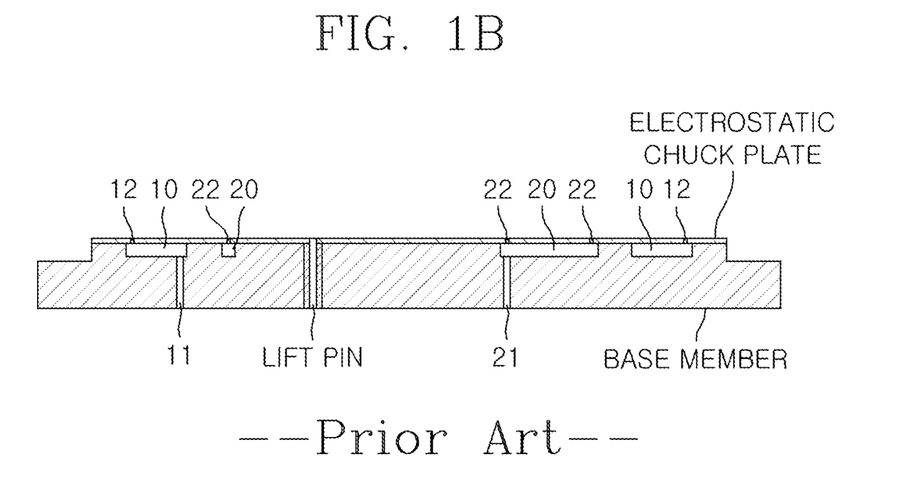

FIGS. 1A and 1B are a view illustrating a cooling structure of an electrostatic chuck according to the related art. That is, FIG. 1A is a top view illustrating a cooling flow path pattern formed on an upper surface of a base member, and FIG. 1B is a sectional view of an electrostatic chuck taken along line A-A' illustrated in FIG. 1A.

As illustrated in FIGS. 1A and 1B, a conventional electrostatic chuck 1 includes a base member having a plurality of first cooling gas holes 11 and 21, and an electrostatic chuck plate having a plurality of second cooling gas holes 12 and 22. Here, the first cooling gas holes 11 and 21 formed in the base member are holes into which a cooling gas flows in from an external feeder (not illustrated), and the second cooling gas holes 12 and 22 formed in the electrostatic chuck plate are holes to which a cooling gas inside the electrostatic chuck 1 is discharged (emitted) in a direction of a substrate (not illustrated).

A cooling flow path pattern for uniformly diffusing a cooling gas flowing in from outside is provided on an upper surface of the base member. The cooling flow path patterns is made up of an outer flow path pattern 10 for diffusing the cooling gas to an outer region of the upper surface of the base member, and an inner flow path pattern 20 for diffusing the cooling gas to an inner region of the upper surface of the base member. In this case, the outer flow path pattern 10 is configured to connect one first cooling gas hole 11 and a plurality of second cooling gas holes 12. In addition, the inner flow path pattern 20 is configured to connect a plurality of first cooling gas holes (He inlets) 21 and a plurality of second cooling gas holes (He outlets) 22, both of which are arranged in a predetermined pattern.

In the conventional electrostatic chuck 1, due to a problem that only one first cooling gas hole 11 is connected to the outer flow path pattern 10 and is located at an outer edge region of the outer flow path pattern 10, a problem of non-uniformity of the cooling gas discharged to the substrate occurs inevitably. For example, there occurs a problem that a density of the cooling gas discharged from the second cooling gas holes 12 located far away from the first cooling gas hole 11 is relatively low, and a density of the cooling gas discharged from the second cooling gas holes 12 located adjacent to the first cooling gas to hole 11 is relatively high.

Further, a process gas existing in the chamber in a plasma state flows through the plurality of second cooling gas holes 12 and 22 formed in the electrostatic chuck plate and reacts with a metal material of the base member. Thereby, there is a problem that a plasma discharge phenomenon (or an arcing phenomenon) frequently occurs at surroundings of the plurality of second cooling gas holes 12 and 22.

In this way, the conventional electrostatic chuck 1, which has an asymmetric arrangement structure of the first cooling gas hole 11 connected to the outer flow path pattern 10 and a non-insulating structure around the plurality of second cooling gas holes 12 and 22, causes non-uniformity of the density of the cooling gas discharged to the substrate, and thus invites a problem of various semiconductor processes such as plasma discharge, PR burning, and under etching.

SUMMARY OF THE INVENTION

An objective of the present disclosure is to solve the above-mentioned problems and other problems, and another object of the present disclosure is to provide an electrostatic chuck in which a plasma discharge phenomenon is improved.

Yet another objective of the present disclosure is to provide an electrostatic chuck in which a density of a cooling gas discharged to a substrate is uniform.

Yet still another objective of the present disclosure is to provide an electrostatic chuck having a new cooling flow path pattern.

Yet still another objective of the present disclosure is to provide an electrostatic chuck having the number of cooling gas holes optimized for a cross-sectional area of a cooling flow path.

Yet still another objective of the present disclosure is to provide an electrostatic chuck having an insulating structure around a plurality of cooling gas holes formed in an electrostatic chuck plate.

To achieve the above or other objectives, according to an aspect of the present disclosure, there is provided an electrostatic chuck that comprises: an electrostatic chuck plate configured to include a plurality of first cooling gas holes formed in a first region and a plurality of second cooling gas holes formed in a second region; and a base member configured to include a first flow path pattern connected to the plurality of first cooling gas holes, a second flow path pattern connected to the plurality of second cooling gas holes, and an inlet moving pattern changing a position of an inlet of a cooling gas injected into the first flow path pattern.

According to another aspect of the present disclosure, there is provided an electrostatic chuck that comprises: a base member; and an electrostatic chuck plate configured to include an insulating layer on the base member, an electrode layer on the insulating layer, and a dielectric layer on the electrode layer, wherein the dielectric layer includes a plurality of first cooling gas holes formed in a first region, and a plurality of second cooling gas holes formed in a second region, and the insulating layer has a first flow path pattern connected to the plurality of first cooling gas holes, a second flow path pattern connected to the plurality of second cooling gas holes, and an inlet moving pattern changing a position of an inlet of a cooling gas injected into the first flow path pattern.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE INVENTION

Hereinafter, embodiments disclosed herein will be described in detail with reference to the attached drawings. Identical or similar constituent elements are denoted with the same reference numerals regardless of the drawing numbers, and a duplicate description thereof will be omitted. In the following description of the embodiments according to the present disclosure, in the case where a layer (film), region, pattern or structure is referred to as being "on" or "under" another substrate, layer (film), region, pad, or pattern, this denotes that the layer (film), region, pattern or structure is formed directly on/under the other substrate, layer (film), region, pad, or pattern, or is formed indirectly on/under the other substrate, layer (film), region, pad, or pattern via one or more intervening layers. Further, the description relative to on or under of each layer will be given based on the drawings. In the drawings, the thickness or size of each layer is exaggerated, omitted, or schematically illustrated for convenience and clarity of description. In addition, the size of each constituent element does not entirely reflect the actual size thereof.

Further, in the description of the embodiments disclosed herein, a detailed description of the related well-known art will be omitted when it may make the subject matters of the embodiments disclosed herein unclear. Further, it should be understood that the attached drawings are provided only to help easy understanding of the embodiments disclosed herein, and the technical idea disclosed herein is not limited by the attached drawings and covers all modifications, equivalents, and alternatives falling within the idea and technical scope of the present disclosure.

The present disclosure suggests an electrostatic chuck having an improved plasma discharge phenomenon. Further, the present disclosure suggests an electrostatic chuck in which a cooling gas discharged to a substrate has a uniform density. Further, the present disclosure suggests an electrostatic chuck having a new cooling flow path pattern. Further, the present disclosure suggests an electrostatic chuck having the number of cooling gas holes optimized for a cross-sectional area of a cooling flow path. Further, the present disclosure suggests an electrostatic chuck in which surrounds of a plurality of cooling gas holes formed in an electrostatic chuck plate have insulating structures.

Hereinafter, various embodiments of the present disclosure will be described in detail with reference to the drawings.

Figure 2A:
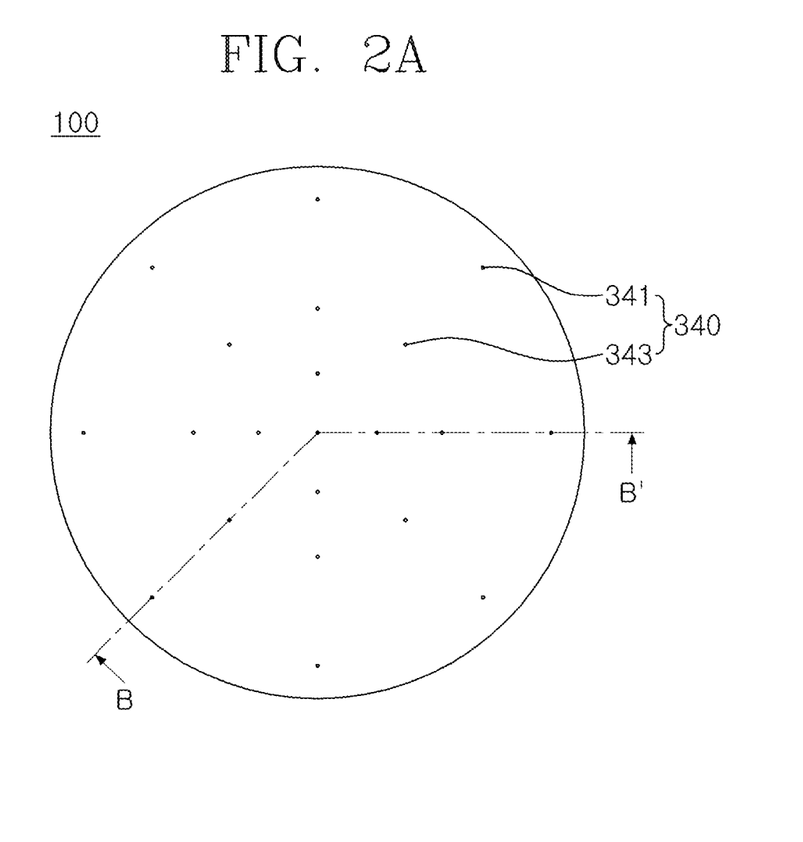
FIG. 2A is a view illustrating an upper-surface shape of an electrostatic chuck according to an embodiment of the present disclosure.
Figure 2B:
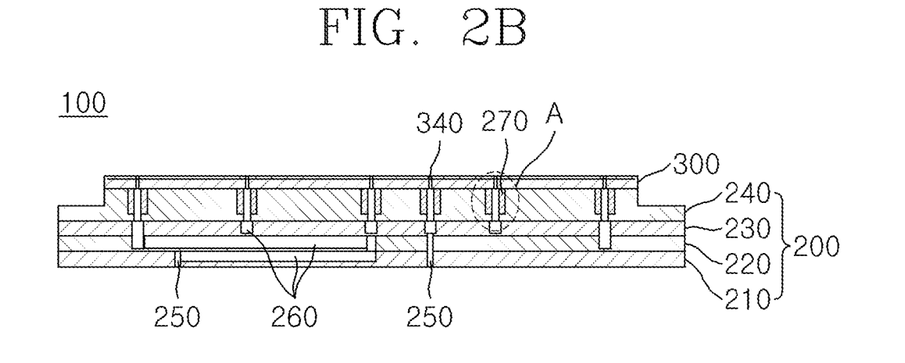
FIG. 2B is a view illustrating a cross-sectional shape of the electrostatic chuck taken along line B-B' illustrated in FIG. 2A.
Figure 2C:
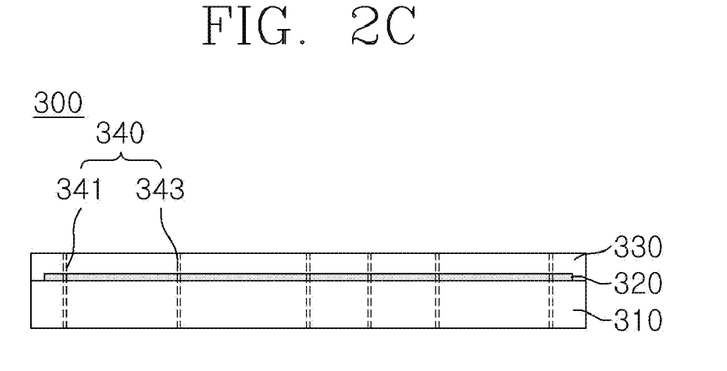
FIG. 2C is a view illustrating a cross-sectional shape of an electrostatic chuck plate illustrated in FIG. 2B.
Figure 2D:
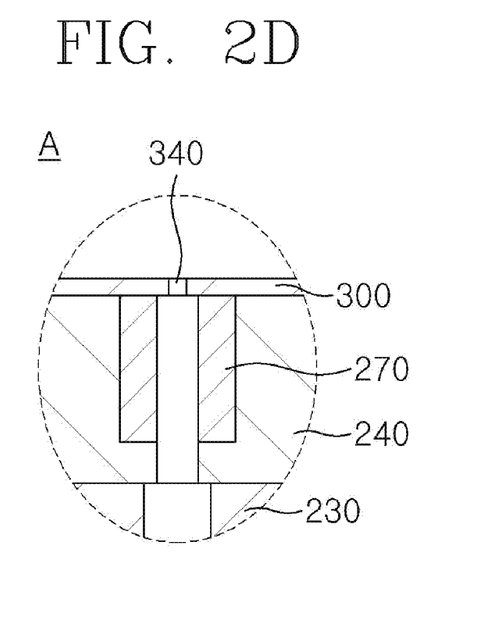
FIG. 2D is an enlarged view illustrating part A illustrated in FIG. 2B.

FIG. 2A is a view illustrating an upper-surface shape of an electrostatic chuck according to an embodiment of the present disclosure. FIG. 2B is a view illustrating a cross-sectional shape of the electrostatic chuck taken along line B-B' illustrated in FIG. 2A. FIG. 2C is a view illustrating a cross-sectional shape of an electrostatic chuck plate illustrated in FIG. 2B. FIG. 2D is an enlarged view illustrating part A illustrated in FIG. 2B.

Referring to FIGS. 2A to 2D, an electrostatic chuck 100 according to an embodiment of the present disclosure includes a base member 200 and an electrostatic chuck plate 300 disposed above the base member 200. Although not illustrated, a bonding layer (not illustrated) for bonding the base member 200 and the electrostatic chuck plate 300 may be formed between the base member 200 and the electrostatic chuck plate 300.

The electrostatic chuck 100 may have a cooling structure for uniformly cooling a substrate inside a chamber using an external cooling gas. To implement this cooling structure, the base member 200 may have a plurality of first cooling gas holes 250 and cooling flow path patterns 260, and the electrostatic chuck plate 300 may have a plurality of second cooling gas holes 340. As the cooling gas, a helium (He) gas may be mainly used, but is not necessarily limited thereto.

The base member 200 may have a multi-layer structure made up of a plurality of metal layers. As an example, the base member 200 may include a first metal layer 210, a second metal layer 220, a third metal layer 230, and a fourth metal layer 240 that are staked in order. In this case, each of the metal layers 210 and 240 may be joined by, for example, a brazing process, a welding process, or a bonding process.

The cooling flow path patterns 260 for diffusing a cooling gas in a horizontal direction may be provided to at least one of the first to fourth metal layers 210 to 240. Here, the cooling flow path patterns 260 may include an outer flow path pattern for diffusing a cooling gas to an outer region of the base member 200, an inner flow path pattern for diffusing a cooling gas to an inner region of the base member 200, and an inlet moving pattern for changing a position of the first cooling gas hole connected to the outer flow path pattern.

The plurality of first cooling gas holes 250 for allowing a cooling gas to flow in a vertical direction may be provided to at least one of the first to fourth metal layers 210 to 240.

In this case, the plurality of first cooling gas holes 250 may be configured to be connected to the cooling flow path patterns formed in the base member 200. Here, the plurality of first cooling gas holes 250 may include a first outer cooling gas hole that is connected to the outer flow path pattern inside the base member 200, and a first inner cooling gas hole that is connected to the inner flow path pattern inside the base member 200. This will be described in greater detail below with reference to FIGS. 3 to 8.

The first to third metal layers 210 to 230 may be configured to have thicknesses and sizes identical or similar to each other. Meanwhile, the fourth metal layer 240 located at an uppermost portion of the base member 200 may be configured to have a greater thickness than the other metal layers 210 to 230. Further, the fourth metal layer 240 may be configured such that an edge region thereof has a given step structure.

The electrostatic chuck plate 300 is a multi-layer structure that functions as an electrostatic chuck, and includes an insulating layer 310, an electrode layer 320 on the insulating layer 310, and a dielectric layer 330 on the electrode layer 320.

The insulating layer 310 may be formed of a ceramic material. As an embodiment, the insulating layer 310 may be formed of aluminum oxide ($Al_2O_3$). As another embodiment, the insulating layer 310 may further include at least one of aluminum nitride (AlN), silicon carbide (SiC), and silicon nitride ($Si_3N_4$) in addition to aluminum oxide ($Al_2O_3$).

The insulating layer 310 may be formed by performing a thermal spray coating process on an upper surface of the base member 200. The insulating layer 310 formed in this way functions to insulate the base member 200 from the electrode layer 320.

The electrode layer 320 may be formed of a conductive metal material. As an example, the electrode layer 320 may be formed of at least one of silver (Ag), gold (Au), nickel (Ni), tungsten (W), molybdenum (Mo), and titanium (Ti), and preferably tungsten (W).

The electrode layer 320 may be formed using a thermal spray coating process or a screen print process. The electrode layer 320 has a thickness of about 30 μm to 50 μm. For example, if the thickness of the electrode layer 320 is less than 30 μm, this is unadvisable because a resistance value is increased due to a porosity inside the electrode layer and other defects, and a phenomenon in that an electrostatic suction force is reduced depending on an increase in the resistance value. Further, if the thickness of the electrode layer 320 exceeds 50 μm, this is unadvisable because an overcurrent occurs to cause an arcing phenomenon. Therefore, the thickness of the electrode layer 320 preferably has a range from about 30 μm to 50 μm.

The electrode layer 320 may be formed to have various structures such as a planar structure, a spiral structure, or a concentric circle structure. The electrode layer 320 formed in this way functions to generate electrostatic force for holding a substrate (not illustrated) placed on the dielectric layer 330.

The dielectric layer 330 may be formed of a ceramic material. As an embodiment, the dielectric layer 330 may be formed of aluminum oxide ($Al_2O_3$) that is the same material as the above-mentioned insulating layer 310. As another embodiment, the dielectric layer 330 may further include at least one of silicon oxide ($SiO_2$), barium oxide (BaO), zinc oxide (ZnO), cobalt oxide (CoO), tin oxide ($SnO_2$), and a zirconium oxide (ZrO2) in addition to aluminum oxide ($Al_2O_3$).

The dielectric layer 330 may be formed by performing a thermal spray coating process on upper surfaces of the insulating layer 310 and the electrode layer 320. The dielectric layer 330 formed in this way functions as a dielectric such that electrostatic force is formed by the electrode layer 320.

In this way, the electrostatic chuck plate 300 formed in a multi-layer structure may include the plurality of second cooling gas holes 340 that discharge a cooling gas for cooling a substrate. In this case, the plurality of second cooling gas holes 340 may be configured to be connected to the cooling flow path patterns formed inside the base member 200. Here, the plurality of second cooling gas holes 340 may include a second outer cooling gas hole 341 that is connected to the outer flow path pattern inside the base member 200, and a second inner cooling gas hole 343 that is connected to the inner flow path pattern inside the base member 200.

The plurality of second cooling gas holes 340 formed in the electrostatic chuck plate 300 may be arranged in a predetermined pattern. Further, the plurality of second cooling gas holes 340 may be formed to have a predetermined number and size. For example, in the present embodiment, the configuration in which eight outer helium holes 341 and thirteen inner helium holes 343 are provided to the electrostatic chuck plate 300 is given by way of example, but the present embodiment is not necessarily limited thereto.

Meanwhile, in the case where surroundings of the plurality of second cooling gas holes 340 formed in the electrostatic chuck plate 300 satisfy a mean free path caused by a specific pressure, plasma discharge occurs easily. To prevent this plasma discharge phenomenon, there is a need to reinforce surroundings of the second cooling gas holes 340 with a given insulating material. Thus, the fourth metal layer 240 adjacent to the electrostatic chuck plate 300 may include a plurality of insulating members 270 that can effectively remove a plasma discharge phenomenon generated when a process gas injected in a plasma state through the second cooling gas holes 340 formed in the electrostatic chuck plate 300 meets the metal layer.

For example, as illustrated in FIG. 2D, each of the insulating members 270 may be disposed at a lower portion of the electrostatic chuck plate 300 which is a region adjacent to the second cooling gas holes 340 formed in the electrostatic chuck plate 300. Further, each of the insulating members 270 may be formed to surround at least a part of each of the first cooling gas holes 250 formed in the fourth metal layer 240 of the base member 200. As an example, each of the insulating members 270 may be formed in a cylindrical shape, but is not necessarily limited thereto.

The insulating members 270 may be configured to have heights equal to or lower than that of the fourth metal layer 240. Further, each of the insulating members 270 may be formed of a given insulating material. As an embodiment, each of the insulating members 270 may be formed of aluminum oxide ($Al_2O_3$) that is the same material as the above-mentioned insulating layer 310 and dielectric layer 330. Further, each of the insulating members 270 may be formed of polyetheretherketone (PEEK), polyamide-imide (PAI), or polybenzimidazole (PBI).

In the present embodiment, the configuration in which the base member is made up of four metal layers is given by way of example, but the present embodiment is not limited thereto. It will be apparent to those skilled in the art that the base member can be made up of metal layers that are less than or more than the four metal layers.

As described above, the electrostatic chuck according to the embodiment of the present disclosure has a new cooling flow path pattern for solving a problem of an asymmetric arrangement structure of the first outer cooling gas hole formed in the base member, and thereby a density of the cooling gas discharged to the substrate through the plurality of second cooling gas holes formed in the electrostatic chuck plate can be uniformly implemented. Further, the electrostatic chuck has the plurality of insulating members disposed on the surroundings of the second cooling gas holes formed in the electrostatic chuck plate, and thereby a plasma discharge phenomenon generated when the process gas meets the metal layer in a plasma state can be effectively prevented.

FIGS. 3 to 8 are views illustrating a cooling structure formed at a plurality of metal layers constituting a base member.

Figure 3:
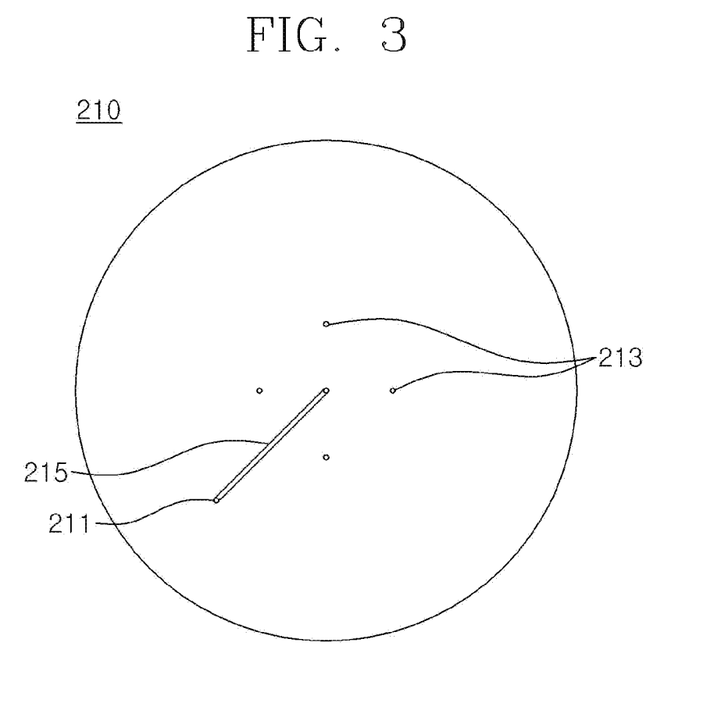
FIGS. 3 to 8 are views illustrating a cooling structure formed at a plurality of metal layers constituting a base member.

First, FIG. 3 is a top view illustrating a cooling structure formed at a first metal layer. As illustrated in FIG. 3, the first metal layer (or the inlet moving layer) 210 may include a single first outer cooling gas hole 211, a plurality of first inner cooling gas holes 213, and an inlet moving pattern 215.

The first outer cooling gas hole 211 may be disposed in an outer region (i.e., an edge region) of an upper surface of the first metal layer 210. Further, the first outer cooling gas hole 211 has a predetermined shape, and may be formed to pass through the first metal layer 210 in a vertical direction. Thus, an external cooling gas flows through the first outer cooling gas hole 211 and moves to the inlet moving pattern 215 of the first metal layer 210.

The plurality of first inner cooling gas holes 213 may be disposed in an inner region (i.e., a middle region) of the upper surface of the first metal layer 210 at regular intervals (i.e., at equal intervals). Likewise, the plurality of first inner cooling gas holes 213 have predetermined shapes, and may be formed to pass through the first metal layer 210 in a vertical direction. Thus, an external cooling gas flows through the plurality of first inner cooling gas holes 213 and moves to the second metal layer 220.

The inlet moving pattern 215 is a path that diffuses (or horizontally moves) a cooling gas flowing in from one point of the first metal layer 210 to another point, and may be configured to extend from the first outer cooling gas hole 211 disposed in the outer region of the first metal layer 210 to one point of the inner region of the first metal layer 210. Thus, the cooling gas injected from the outer region of the first metal layer 210 moves to one point of the inner region of the first metal layer 210 along the inlet moving pattern 215.

The inlet moving pattern 215 may be formed with a fixed width in a straight line shape. Further, the inlet moving pattern 215 may be formed by etching the upper surface of the first metal layer 210 by a predetermined depth. The inlet moving pattern 215 functions to move a position of the first outer cooling gas hole connected to the outer flow path pattern of the base member from the outer region to the inner region. Therefore, the inlet moving pattern 215 can solve a non-uniform density problem of the cooling gas which is caused due to the asymmetric arrangement structure of the first outer cooling gas hole formed in a conventional electrostatic chuck.

Figure 4:
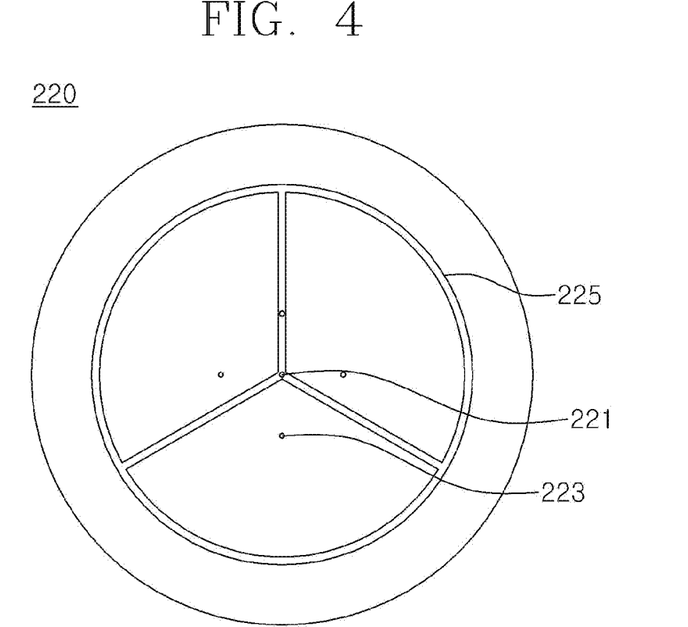
Figure 5:
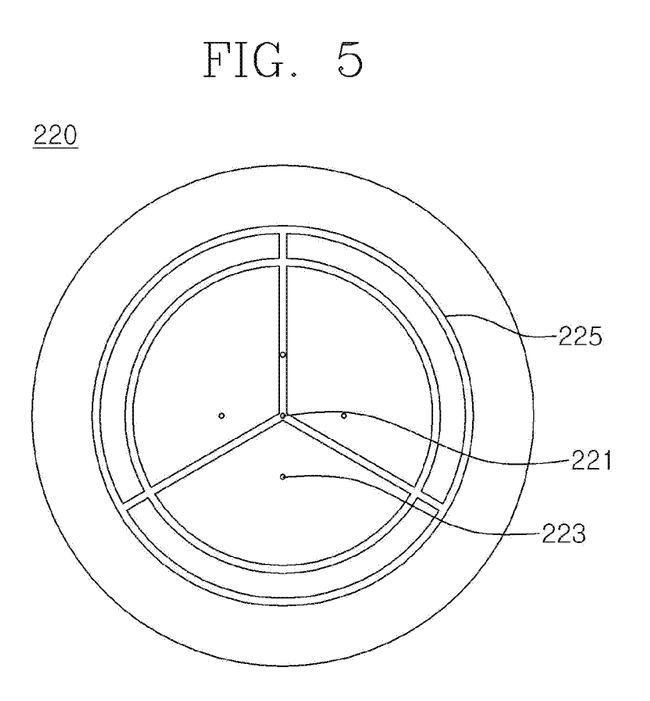

FIGS. 4 and 5 are top views illustrating a cooling structure formed in a second metal layer. As illustrated in FIGS. 4 and 5, the second metal layer (or the outer flow path pattern layer) 220 may include a single first outer cooling gas hole 221, a plurality of first inner cooling gas holes 223, and an outer flow path pattern 225.

The first outer cooling gas hole 221 may be disposed at one point of an inner region of the second metal layer 220. In this case, the first outer cooling gas hole 221 may be connected to the inlet moving pattern 215 of the first metal layer 210. Further, the first outer cooling gas hole 221 has a predetermined shape, and may be formed to pass through the second metal layer 220 in a vertical direction. Thus, the cooling gas injected from the first metal layer 210 flows through the first outer cooling gas hole 221 and moves to the outer flow path pattern 225 of the second metal layer 220.

The plurality of first inner cooling gas holes 223 may be disposed in an inner region of an upper force of the second metal layer 220 at regular intervals. The plurality of first inner cooling gas holes 223 may be disposed to correspond to the positions of the plurality of first inner cooling gas holes 213 formed in the first metal layer 210. Likewise, the plurality of first inner cooling gas holes 223 have predetermined shapes, and may be formed to pass through the second metal layer 220 in a vertical direction. Thus, the cooling gas injected from the first metal layer 210 flows through the plurality of first inner cooling gas holes 223 and moves to an inner flow path pattern of the third metal layer 230.

The outer flow path pattern 225 is a path that diffuses (or horizontally moves) a cooling gas flowing in from one point of the inner region of the second metal layer 220 to the outer region of the second metal layer 220, and may be configured to extend from the first outer cooling gas hole 221 disposed in the inner region of the second metal layer 220 to one point of the outer region of the second metal layer 220 in a radial shape. Thus, the cooling gas injected through the first outer cooling gas hole 221 formed in the second metal layer 220 moves to the outer region of the second metal layer 220 along the outer flow path pattern 225.

As an embodiment, as illustrated in FIG. 4, the outer flow path pattern 225 may include first to third linear paths that are configured to radially extend from one point of the inner region of the second metal layer 220, and a circular path that is configured to extend in a circular shape so as to meet end points of the first to third linear paths.

As another embodiment, as illustrated in FIG. 5, the outer flow path pattern 225 may include first to third linear paths that are configured to radially extend from one point of the inner region of the second metal layer 220, a first circular path that is configured to extend in a circular shape so as to meet end points of the first to third linear paths, and a second circular path that passes through parts of the first to third linear paths and is formed to be smaller than the first circular path. In addition, it will be apparent to those skilled in the art that the outer flow path pattern having various shapes can be formed.

The outer flow path pattern 225 may be formed by etching the upper surface of the second metal layer 220 by a given depth. The outer flow path pattern 225 functions to uniformly distribute the cooling gas injected through the first outer cooling gas hole 221 formed in the second metal layer 220 to surrounding regions.

Figure 6:
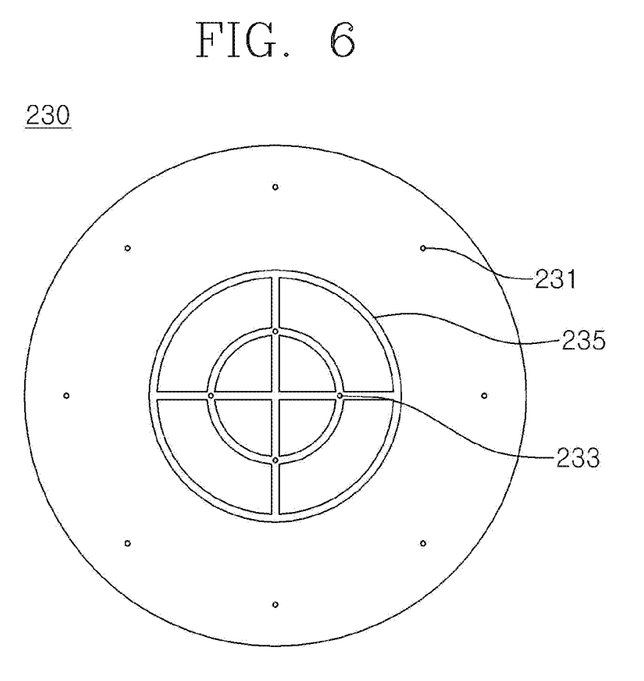
Figure 7:
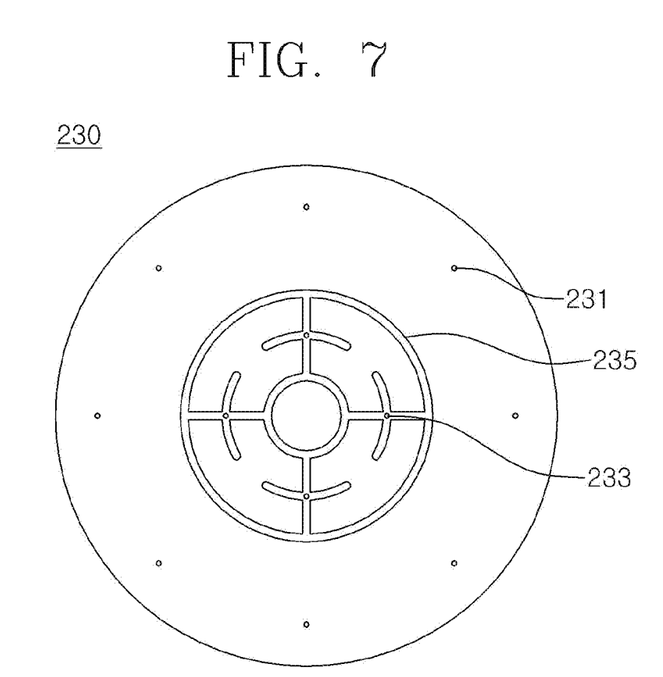

FIGS. 6 and 7 are top views illustrating a cooling structure formed in a third metal layer. As illustrated in FIGS. 6 and 7, the third metal layer (or the inner flow path pattern layer) 230 may include a plurality of first outer cooling gas holes 231, a plurality of first inner cooling gas holes 233, and an inner flow path pattern 235.

The plurality of first outer cooling gas holes 231 may be disposed in an outer region of an upper surface of the third metal layer 230 at regular intervals. In this case, the plurality of first outer cooling gas holes 231 may be connected to the outer flow path pattern 225 formed in the second metal layer 220. Further, the plurality of first outer cooling gas holes 231 may be connected to a plurality of first outer cooling gas holes 241 formed in the fourth metal layer 240. Thus, the cooling gas injected from the second metal layer 220 flows through the plurality of first outer cooling gas holes 231 and moves to the fourth metal layer 240.

The plurality of first inner cooling gas holes 233 may be disposed in an inner region of the upper surface of the third metal layer 230 at regular intervals (i.e., at equal intervals). The plurality of first inner cooling gas holes 233 may be disposed to correspond to the positions of the plurality of first inner cooling gas holes 223 formed in the second metal layer 220. Thus, the cooling gas injected from the second metal layer 220 flows through the plurality of first inner cooling gas holes 233 and moves to the inner flow path pattern 235 of the third metal layer 230.

The inner flow path pattern 235 is a path that diffuse (or horizontally moves) a cooling gas flowing in from the inner region of the upper surface of the third metal layer 230 to surrounding regions, and may be formed in a predetermined shape. Thus, the cooling gas injected through the plurality of first inner cooling gas holes 233 formed in the third metal layer 230 moves to surrounding regions of the metal layer 230 along the inner flow path pattern 235.

As an embodiment, as illustrated in FIG. 6, the inner flow path pattern 235 may include a first linear path that passes through a central point of the third metal layer 230 and some of the first inner cooling gas holes, a second linear path that passes through the central point of the third metal layer 230 and the other of the first inner cooling gas holes, a first circular path that is configured to extend in a circular shape so as to meet ends of the first and second linear paths, and a second circular path that passes through parts of the first and second linear paths and is formed to be smaller than the first circular path. Here, the first and second linear paths may be formed to make a right angle with each other.

As another embodiment, as illustrated in FIG. 7, the inner flow path pattern 235 may include a first circular path that has a first radius having the center of the upper surface of the third metal layer 230, a second circular path that has a second radius smaller than the first radius, first to fourth linear paths that linearly connect between the first circular path and the second circular path, and first to fourth curved paths that are configured to extend from middle points of the first to fourth linear paths in a circumferential direction by a given distance. In addition, it will be apparent to those skilled in the art that the inner flow path pattern having various shapes can be formed.

The inner flow path pattern 235 may be formed by etching the upper surface of the third metal layer 230 by a given depth. The inner flow path pattern 235 functions to uniformly distribute the cooling gas injected through the first inner cooling gas hole 223 formed in the third metal layer 230 to surrounding regions.

Figure 8:
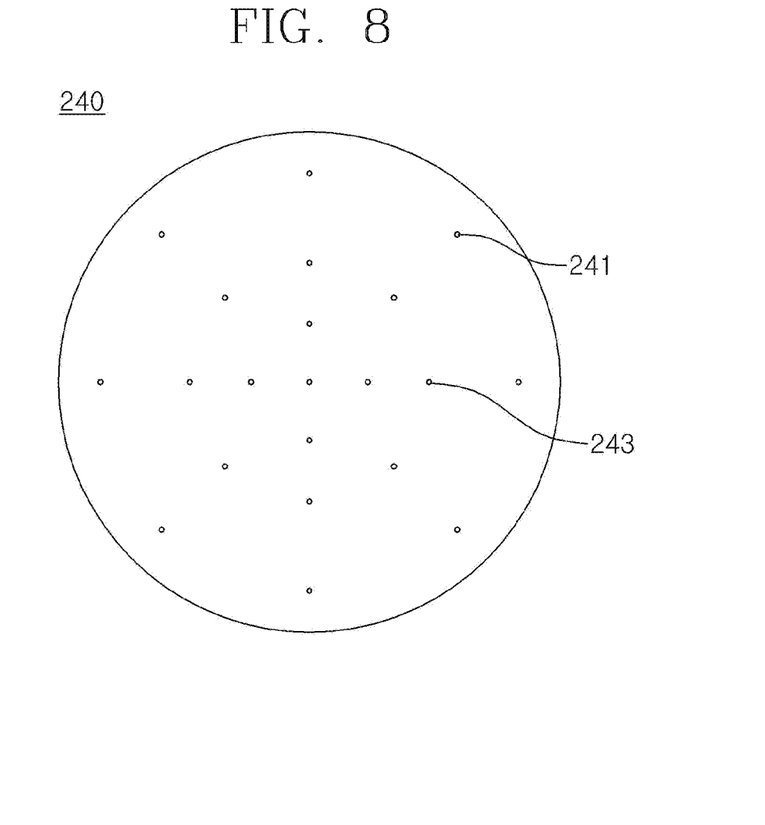

FIG. 8 is a top view illustrating a cooling structure formed in a fourth metal layer. As illustrated in FIG. 8, the fourth metal layer 240 may include a plurality of first outer cooling gas holes 241 and a plurality of first inner cooling gas holes 243.

The plurality of first outer cooling gas holes 241 may be disposed in an outer region of an upper surface of the fourth metal layer 240. In this case, the plurality of first outer cooling gas holes 241 may be connected to the plurality of first outer cooling gas holes 231 formed in the third metal layer 230. Further, the plurality of first outer cooling gas holes 241 may be connected to the plurality of second outer cooling gas holes 341 formed in the electrostatic chuck plate 300. Thus, the cooling gas injected from the third metal layer 230 flows through the plurality of first outer cooling gas holes 241 and moves to the electrostatic chuck plate 300. The electrostatic chuck plate 300 allows the cooling gas injected from the fourth metal layer 240 to be discharged outside through the plurality of second outer cooling gas holes 341.

The plurality of first inner cooling gas holes 243 may be disposed in an inner region of the upper surface of the fourth metal layer 240 at regular intervals. In this case, the plurality of first inner cooling gas holes 243 may be connected to the inner flow path pattern 235 formed at the third metal layer 230. Further, the plurality of first inner cooling gas holes 243 may be connected to the plurality of second inner cooling gas holes 343 formed in the electrostatic chuck plate 300. Thus, the cooling gas injected from the third metal layer 230 flows through the plurality of first inner cooling gas holes 243 and moves to the electrostatic chuck plate 300. The electrostatic chuck plate 300 allows the cooling gas injected from the fourth metal layer 240 to be discharged outside through the plurality of second inner cooling gas holes 343.

In the present embodiment described above, the configuration in which the cooling structure having the inlet moving pattern, the outer flow path pattern, and the inner flow path pattern is formed inside the base member is given by way of example, but the present embodiment is not necessarily limited thereto. Therefore, it will be apparent to those skilled in the art that the cooling structure having the inlet moving pattern, the outer flow path pattern, and the inner flow path pattern can be formed inside the electrostatic chuck plate, namely at the insulating layer. In this case, only the plurality of cooling gas holes may be configured to be formed in the base member, and the plurality of insulating members may be configured to be omitted from the electrostatic chuck plate.

Meanwhile, in spite of the inlet moving pattern 215 formed in the base member 200, there is a problem that density (flow rate) distribution of the cooling gas discharged through the second outer cooling gas holes 341 formed in the electrostatic chuck plate 300 is relatively less uniform than that of the cooling gas discharged through the plurality of second inner cooling gas holes 343 formed in the electrostatic chuck plate 300. This is because a single first outer cooling gas hole is formed in the bottom surface of the base member 200, whereas several first inner cooling gas holes are formed in the bottom surface of the base member 200. Thus, there is a need to apply the number of outer cooling gas holes optimized for a cross-sectional area of the cooling flow path to make the density of the cooling gas discharged from the outer region of the electrostatic chuck plate 300 more uniform.

FIGS. 9A to 9D illustrate results of testing hole-specific He flow rate distribution according to the number of outer cooling gas holes formed in an edge region of an electrostatic chuck plate according to an embodiment of the present disclosure.

Figure 9A:
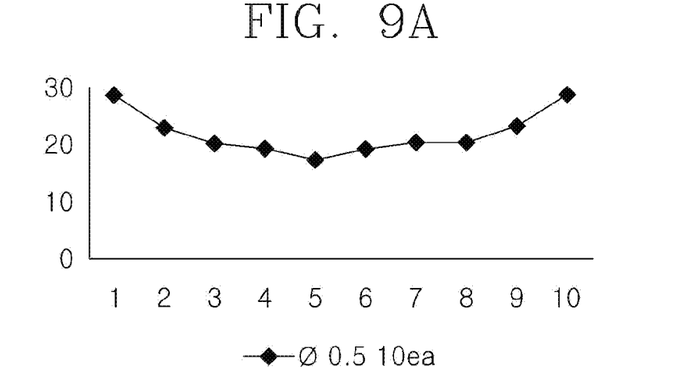
FIGS. 9A to 9D illustrate results of testing hole-specific He flow rate distribution according to the number of outer cooling gas holes formed in an edge region of an electrostatic chuck plate according to an embodiment of the present disclosure.
Figure 9B:
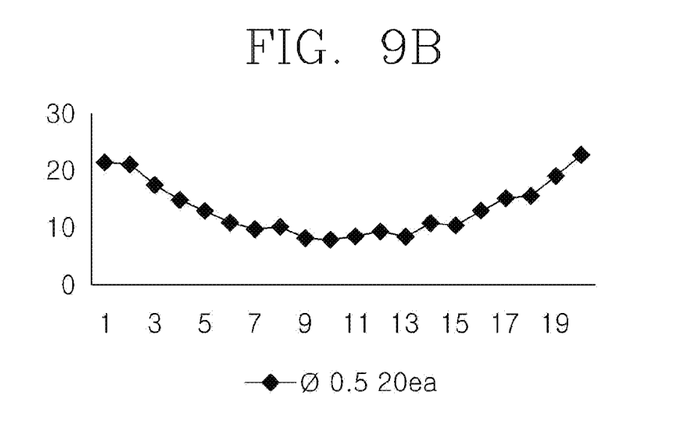
Figure 9C:
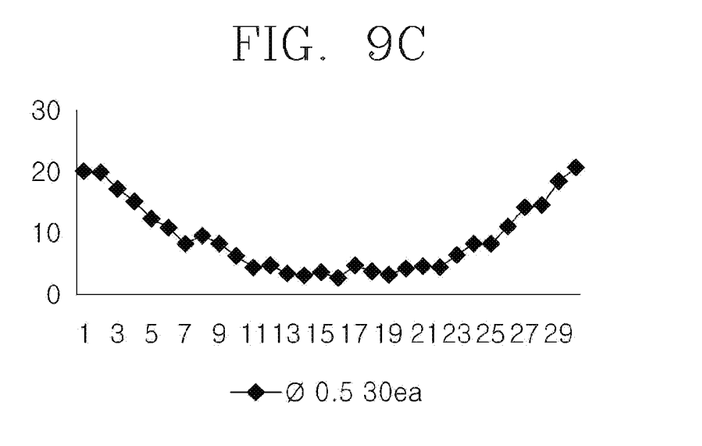
Figure 9D:
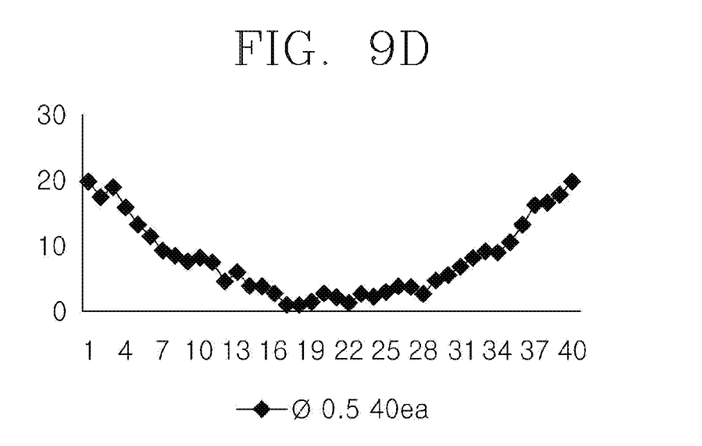

To be more specific, FIG. 9A is a graph illustrating a first test example in which He flow rate distribution of each outer cooling gas hole is measured for the electrostatic chuck in which ten outer cooling gas holes are formed. FIG. 9B is a graph illustrating a second test example in which He flow rate distribution of each outer cooling gas hole is measured for the electrostatic chuck in which 20 outer cooling gas holes are formed. FIG. 9C is a graph illustrating a third test example in which He flow rate distribution of each outer cooling gas hole is measured for the electrostatic chuck in which 30 outer cooling gas holes are formed. Finally, FIG. 9D is a graph illustrating a fourth test example in which He flow rate distribution of each outer cooling gas hole is measured for the electrostatic chuck in which 40 outer cooling gas holes are formed.

Various parameter values (e.g., a maximum value, a minimum value, a maximum-minimum value, a sum value, an average value, a standard deviation value, a minimum/maximum value, etc.) are calculated on the basis of cooling gas hole-specific flow rate values measured in the first to fourth test examples illustrated in FIG. 9, and are summarized as in Table 1 below.

TABLE 1

|  | First test example | Second test example | Third test example | Fourth test example |
|---|---|---|---|---|
| Number of outer cooling gas holes | 10 | 20 | 30 | 40 |
| MAX | 28.511 | 22.666 | 20.666 | 19.728 |
| MIN | 16.974 | 7.694 | 2.823 | 1.054 |
| MAX − MIN | 11.537 | 14.972 | 17.843 | 18.674 |
| SUM | 218.928 | 266.047 | 276.625 | 325.704 |
| AYR | 21.893 | 13.302 | 9.221 | 8.143 |
| STD DEV | 3.67 | 4.67 | 5.70 | 5.79 |
| MIN/MAX | 59.5% | 33.9% | 13.7% | 5.3% |

In Table 1 above, MAX is a maximum value of the hole-specific flow rate values measured in each test example, MIN is a minimum value of the hole-specific flow rate values measured in each test example, MAX-MIN is a difference between the maximum value and the minimum value of the hole-specific flow rate values measured in each test example, SUM is a value obtained by summing up all the hole-specific flow rate values measured in each test example, AVR is an average value of all the hole-specific flow rate values measured in each test example, and MIN/MAX is a ratio obtained by dividing the minimum value by the maximum value of the hole-specific flow rate values measured in each test example.

Among these parameters, MAX-MIN, STD DEV, and MIN/MAX are parameters related to uniform distribution of a density of a helium gas. As a result of analyzing MAX-MIN in each test example, if MAX-MIN is less than or equal to 15, it can be found that the density of the helium gas is relatively uniform. Also, as a result of analyzing STD DEV in each test example, if STD DEV is less than or equal to 5, it can be found that the density of the helium gas is relatively uniform. Further, as a result of analyzing MIN/MAX in each test example, if MIN/MAX is more than or equal to 30%, it can be found that the density of the helium gas is relatively uniform.

Therefore, if the number of outer cooling gas holes formed in the edge region of the electrostatic chuck plate is smaller than or equal to 20, and preferably 10, it can be found that the density of the helium gas discharged from the outer cooling gas holes is relatively uniform.

While specific embodiments of the present disclosure have been described, various modifications are possible without departing from the scope of the present disclosure. Therefore, the scope of the present disclosure should not be limited to the described embodiments, but should be defined by the claims set forth below as well as equivalents thereto.

What is claimed is:

1. An electrostatic chuck comprising:
an electrostatic chuck plate configured to include a plurality of first outer cooling gas holes formed in a first region and a plurality of first inner cooling gas holes formed in a second region; and
a base member configured to include a first flow path pattern connected to the plurality of first outer cooling gas holes, a second flow path pattern connected to the plurality of first inner cooling gas holes, and an inlet moving pattern changing a position of an inlet of a cooling gas injected into the first flow path pattern,
wherein the base member includes: a first metal layer at which the inlet moving pattern is formed; a second metal layer at which the first flow path pattern is formed; and a third metal layer at which the second flow path pattern is formed.

2. The electrostatic chuck of claim 1, wherein:
the first region is an outer region of an upper surface of the electrostatic chuck plate; and
the second region is an inner region of the upper surface of the electrostatic chuck plate.

3. The electrostatic chuck of claim 1, wherein the base member is formed in a multi-layer structure made up of a plurality of metal layers.

4. The electrostatic chuck of claim 1, wherein the first to third metal layers are configured to have a same size and thickness one another.

5. The electrostatic chuck of claim 1, wherein the inlet moving pattern is formed to be extended from one point of an outer region of the first metal layer to one point of an inner region of the first metal layer in a straight line.

6. The electrostatic chuck of claim 1, wherein the inlet moving pattern changes a position of a cooling gas hole connected to the first flow path pattern of the second metal layer from an outer region to an inner region of the base member.

7. The electrostatic chuck of claim 1, wherein the inlet moving pattern is formed by etching an upper surface of the first metal layer by a predetermined depth.

8. The electrostatic chuck of claim 1, wherein the first flow path pattern horizontally moves the cooling gas inputted from an inner region of the second metal layer to an outer region of the second metal layer.

9. The electrostatic chuck of claim 1, wherein the first flow path pattern is formed to be extended from a cooling gas hole disposed in an inner region of the second metal layer to an outer region of the second metal layer in a radial shape.

10. The electrostatic chuck of claim 1, wherein the base member further includes a fourth metal layer that is disposed on the third metal layer and comprises a plurality of insulating members disposed in a region adjacent to the first outer and inner cooling gas holes formed in the electrostatic chuck plate.

11. The electrostatic chuck of claim 10, wherein each of the insulating members is configured to surround at least a part of each of cooling gas holes formed in the fourth metal layer.

12. The electrostatic chuck of claim 10, wherein each of the insulating members is formed of aluminum oxide (Al2O3) that is the same material as the electrostatic chuck plate.

13. The electrostatic chuck of claim 10, wherein each of the insulating members is formed of any one of polyetheretherketone (PEEK), polyamide-imide (PAI), and polybenzimidazole (PBI).

14. The electrostatic chuck of claim 10, wherein at least one of the first to fourth metal layers comprises a plurality of second cooling gas holes for passing through an external cooling gas in a vertical direction.

15. The electrostatic chuck of claim 10, wherein a thickness of the fourth metal layer is thicker than that of other metal layers.

16. The electrostatic chuck of claim 1, wherein the number of the first outer cooling gas holes formed in the electrostatic chuck plate is less than or equal to 20.

17. The electrostatic chuck of claim 1, wherein the electrostatic chuck plate comprises an insulating layer, an electrode layer, and a dielectric layer that are staked in order.

18. An electrostatic chuck comprising:
a base member; and
an electrostatic chuck plate configured to include an insulating layer on the base member, an electrode layer on the insulating layer, and a dielectric layer on the electrode layer,
wherein the dielectric layer includes a plurality of first outer cooling gas holes formed in a first region, and a plurality of first inner cooling gas holes formed in a second region,
wherein the insulating layer includes a first flow path pattern connected to the plurality of first outer cooling gas holes, a second flow path pattern connected to the plurality of first inner cooling gas holes, and an inlet moving pattern changing a position of an inlet of a cooling gas injected into the first flow path pattern, and
wherein the insulating layer includes: a first insulating layer at which the inlet moving pattern is formed; a second insulating layer at which the first flow path pattern is formed; and a third insulating layer at which the second flow path pattern is formed.

19. The electrostatic chuck of claim 18, wherein the insulating layer is formed in a multi-layer structure.

* * * * *